United States Patent
Gu (10) Patent No.: US 10,847,598 B2
(45) Date of Patent: Nov. 24, 2020

(54) ORGANIC LIGHT EMITTING DISPLAY PANEL AND ORGANIC LIGHT EMITTING DISPLAY APPARATUS

(71) Applicant: WUHAN TIANMA MICRO-ELECTRONICS CO., LTD., Wuhan (CN)

(72) Inventor: Jiachang Gu, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/231,885

(22) Filed: Dec. 24, 2018

(65) Prior Publication Data

US 2020/0006457 A1    Jan. 2, 2020

(30) Foreign Application Priority Data

Jun. 28, 2018 (CN) .......................... 2018 1 0687305

(51) Int. Cl.
  *H01L 27/32* (2006.01)
  *G09G 3/3233* (2016.01)
  *G09G 3/3266* (2016.01)

(52) U.S. Cl.
  CPC ...... *H01L 27/3276* (2013.01); *H01L 27/3265* (2013.01); *G09G 3/3233* (2013.01); *G09G 3/3266* (2013.01); *G09G 2320/0233* (2013.01)

(58) Field of Classification Search
  None
  See application file for complete search history.

(56) References Cited

U.S. PATENT DOCUMENTS

| | | | |
|---|---|---|---|
| 2015/0001478 A1* | 1/2015 | Choi | H01L 27/124 257/40 |
| 2015/0243722 A1* | 8/2015 | Kwon | H01L 27/3262 257/40 |
| 2016/0291366 A1* | 10/2016 | Hara | G02F 1/1345 |
| 2017/0192580 A1* | 7/2017 | Jung | G06F 3/0416 |
| 2017/0352311 A1* | 12/2017 | Lee | G09G 3/3233 |
| 2018/0219058 A1* | 8/2018 | Xiang | H01L 27/3225 |
| 2019/0189075 A1* | 6/2019 | Kim | H01L 27/1244 |

FOREIGN PATENT DOCUMENTS

| CN | 107705756 A | 2/2018 |
|---|---|---|
| CN | 108281429 A | 7/2018 |

* cited by examiner

*Primary Examiner* — Michelle Mandala
(74) *Attorney, Agent, or Firm* — Anova Law Group PLLC (57) ABSTRACT

An organic light emitting display panel and an organic light emitting display apparatus are provided. The display panel includes an array substrate and a plurality of organic light emitting elements disposed on the array substrate, where the array substrate includes a substrate, and a first metal layer and a second metal layer sequentially disposed toward the plurality of organic light emitting elements; a first display area, a second display area, and a first bezel area, where, in a first direction, a number of organic light emitting elements in a row of organic light emitting elements in the first display area is smaller than a number of organic light emitting elements in a row of organic light emitting elements in the second display area, and the first bezel area is disposed adjacent to the first display area in the first direction; and a plurality of gate signal lines.

16 Claims, 5 Drawing Sheets

ORGANIC LIGHT EMITTING DISPLAY PANEL AND ORGANIC LIGHT EMITTING DISPLAY APPARATUS

CROSS-REFERENCES TO RELATED APPLICATIONS

This application claims the priority of Chinese Patent Application No. 201810687305.2, filed on Jun. 28, 2018, the entire contents of which are incorporated herein by reference.

FIELD OF THE DISCLOSURE

The present disclosure generally relates to the field of display technology and, more particularly, relates to an organic light emitting display panel and an organic light emitting display apparatus.

BACKGROUND

As display technologies advance, structures and shapes of display panels also become diversified. On one hand, based on the needs for irregularly shaped display apparatus, the overall contour shapes of the display panels are no longer limited to the traditional rectangular structure. For example, electronic watches may have a circular display panel. On the other hand, the current display panels evolve from earlier low screen-to-body ratio to now high screen-to-body ratio. To increase the screen-to-body ratio of the display panels, display panels having an R-angle, and/or a "bang" or a notch structure reserved for camera, earphone and other function modules are disclosed in the prior art. Compared to the regular rectangular display panels, the irregularly-shaped display panels may have different number of pixels in different pixel rows. As such, the driving loads of the driving signal lines for driving pixel rows of different number of pixels may be different. When a same driving signal is applied to the driving signal lines, the display brightness of pixel rows having different number of pixels may not be uniform.

To solve the problem, it is proposed that compensation capacitors are connected to the driving signal lines having different driving loads to balance the loads of the driving signal lines. When the driving signal lines are gate signal lines, gate driving circuits may be configured in the bezel area, and compensation capacitors may be configured to connect to the gate signal lines. As such, the bezel area may be widened.

The disclosed organic light emitting display panel and organic light emitting display apparatus are directed to solve one or more problems set forth above and other problems.

BRIEF SUMMARY OF THE DISCLOSURE

One aspect of the present disclosure provides an organic light emitting display panel, comprising: an array substrate and a plurality of organic light emitting elements disposed on the array substrate, where the array substrate includes a substrate, and a first metal layer and a second metal layer sequentially disposed toward the plurality of organic light emitting elements; a first display area, a second display area, and a first bezel area, where, in a first direction, a number of organic light emitting elements in a row of organic light emitting elements in the first display area is smaller than a number of organic light emitting elements in a row of organic light emitting elements in the second display area, and the first bezel area is disposed adjacent to the first display area in the first direction; and a plurality of gate signal lines configured to supply gate driving signals to the organic light emitting elements, the gate signal lines in the first display area extending to the first bezel area. The gate signal lines extending to the first bezel area include first gate signal lines disposed in the first metal layer and second gate signal lines disposed in the second metal layer; at least one row of organic light emitting elements in the first display area are connected to the first gate signal lines; and at least another row of organic light emitting elements in the first display area are connected to the second gate signal lines.

Another aspect of the present disclosure provides an organic light emitting display apparatus. The organic light emitting display apparatus includes an organic light emitting display panel. The organic light emitting display panel includes: an array substrate and a plurality of organic light emitting elements disposed on the array substrate, where the array substrate includes a substrate, and a first metal layer and a second metal layer sequentially disposed toward the plurality of organic light emitting elements; a first display area, a second display area, and a first bezel area, where, in a first direction, a number of organic light emitting elements in a row of organic light emitting elements in the first display area is smaller than a number of organic light emitting elements in a row of organic light emitting elements in the second display area, and the first bezel area is disposed adjacent to the first display area in the first direction; and a plurality of gate signal lines configured to supply gate driving signals to the organic light emitting elements, the gate signal lines in the first display area extending to the first bezel area. The gate signal lines extending to the first bezel area include first gate signal lines disposed in the first metal layer and second gate signal lines disposed in the second metal layer; at least one row of organic light emitting elements in the first display area are connected to the first gate signal lines; and at least another row of organic light emitting elements in the first display area are connected to the second gate signal lines.

Other aspects of the present disclosure can be understood by those skilled in the art in light of the description, the claims, and the drawings of the present disclosure.

BRIEF DESCRIPTION OF THE DRAWINGS

To more clearly illustrate the technical solution in the present disclosure, the accompanying drawings used in the description of the disclosed embodiments are briefly described hereinafter. Obviously, the drawings described below are merely some embodiments of the present disclosure. Other drawings may be derived from such drawings by a person with ordinary skill in the art without creative efforts.

DETAILED DESCRIPTION

To make the foregoing objectives, features and advantages of the present disclosure clearer and more understandable, the present disclosure will be further described with reference to the accompanying drawings and embodiments. However, exemplary embodiments may be embodied in various forms and should not be construed as limited to the embodiments set forth herein. The same reference labels and numerals in the drawings denote the same or similar structures, and will not be described repetitively. The words and expressions of the positions and directions in the description of the present disclosure are illustrative with the pertaining drawings. However, changes may be made if necessary, and all the changes should be included in the scope of protection of the present disclosure. The drawings of the present disclosure are intended only to illustrate relative position relationship. Thicknesses of layers of certain parts may be enlarged for the convenience of comprehension, and may not represent the proportional relationship of the thicknesses of the actual layers.

It should be noted that the specific details set forth in the following description are intended for those skilled in the art to fully understand the present disclosure. However, the present disclosure may be embodied in various other forms. Those skilled in the art may derive other embodiments without departing from the spirit of the present disclosure. Thus, the present disclosure should not be limited to the disclosed embodiments. When certain terms are used to denote certain structures in the specification and the claims, those skilled in the art should understand that hardware manufacturers may use different terms to refer to the same structures. The specification and the claims may not differentiate the structures according to the terminology difference, but rather, according to the functionality difference. When the specification and the claims use the word "comprising" as an open-ended term, it should be interpreted as "including but not limited to". The following specification describes various preferred embodiments of the present disclosure. However, such description is intended to illustrate the general principles of the present disclosure, and is not intended to limit the scope of the present disclosure. The scope of the present disclosure shall be determined by the appended claims.

To solve the problems in the art, the present disclosure provides an organic light emitting display panel and an organic light emitting display apparatus to narrow the bezel area of the organic light emitting display panel and to make the display brightness uniform in all areas of the organic light emitting display panel.

Figure 1:
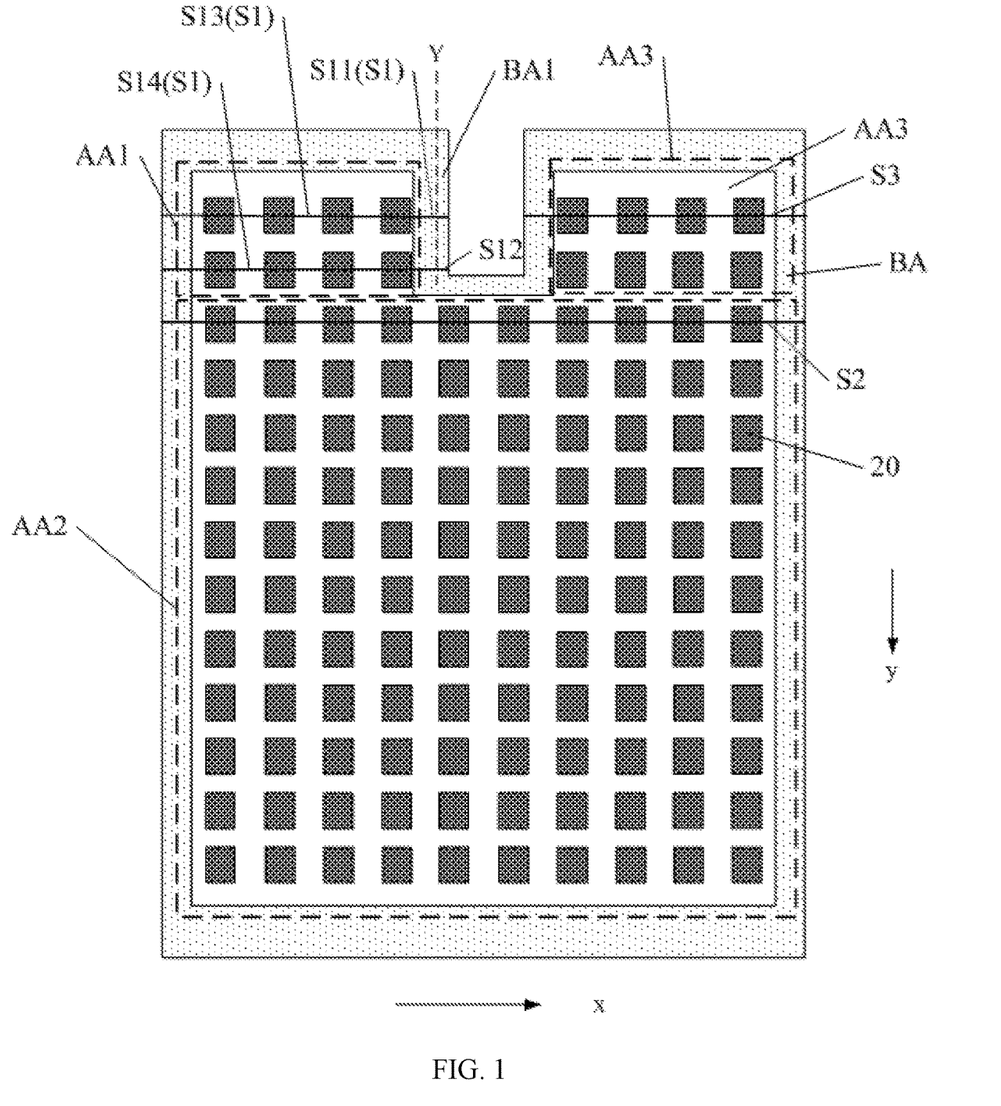
FIG. 1 illustrates a top view of an exemplary organic light emitting display panel according to disclosed embodiments.
Figure 2:
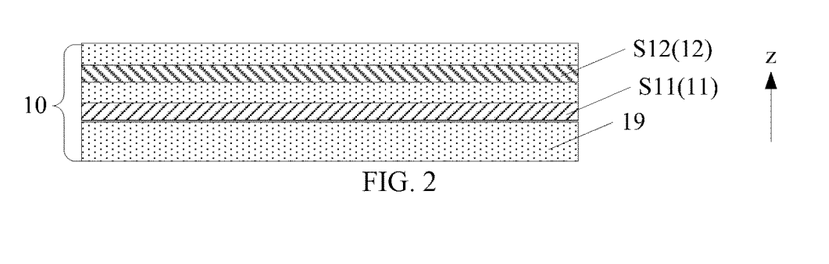
FIG. 2 illustrates a cross-sectional view of film layer structure of an array substrate of an exemplary organic light emitting display panel taken along a line Y in FIG. 1 according to disclosed embodiments.

FIG. 1 illustrates a top view of an exemplary organic light emitting display panel according to disclosed embodiments. FIG. 2 illustrates a cross-sectional view of a substrate of an exemplary organic light emitting display panel according to disclosed embodiments. In one embodiment, as shown in FIG. 1, the organic light emitting display panel may include a substrate 10 and a plurality of organic light emitting elements 20 disposed on the substrate 10. The organic light emitting display panel may further include an encapsulation layer (not shown) that encapsulates the organic light emitting elements 20.

As shown in FIG. 1, the organic light emitting display panel may include a display area AA and a bezel area BA surrounding the display area AA. Due to the shape configuration of the organic light emitting display panel, for example, a circular shape of the organic light emitting display panel, the organic light emitting display panel may have an R-angle or a notch area, which may cause the number of the organic light emitting elements 20 to vary in a certain direction of the organic light emitting display panel. As shown in FIG. 1, the organic light emitting display panel may include a notch area. The display area AA may include a first display area AA1 and a second display area AA2. The bezel area BA may include a first bezel area BA1.

In a first direction x, the number of the organic light emitting elements 20 in a row in the first display area AA1 may be less than the number of the organic light emitting elements 20 in a row in the second display area AA2. For example, as shown in FIG. 1, there are four organic light emitting elements 20 in a row of the organic light emitting elements 20 in the first direction x in the first display area AA1, and there are ten organic light emitting elements 20 in a row of the organic light emitting elements 20 in the first direction x in the second display area AA2. It should be noted that the numbers and the arrangement of the organic light emitting elements 20 shown in FIG. 1 are for illustrative purposes. The difference in the numbers of the organic light emitting elements 20 between the first display area AA1 and the second display area AA2 is not intended to limit the organic light emitting display panel. The first bezel area BA1 may be disposed adjacent to the first display area AA1 in a second direction y.

FIG. 2 illustrates a cross-sectional view of a film layer structure of an array substrate of an exemplary organic light emitting display panel taken along a line Y in FIG. 1 according to disclosed embodiments. As shown in FIG. 2, the array substrate 10 may include a substrate 19, and a first metal layer 11 and a second metal layer 12 sequentially disposed facing toward the organic light emitting elements 20. The array substrate 10 may also include an insulation layer disposed between the first metal layer 11 and the second metal layer 12. Other film layers may also be disposed between the first metal layer 11 and the second metal layer 12.

The organic light emitting display panel may also include a plurality of gate signal lines S extended in the first direction x. The gate signal lines S may be configured to supply gate electrode driving signals to the organic light emitting elements 20. The organic light emitting display panel may also include a plurality of data signal lines (not shown). The data signal lines may be configured to supply data driving signals to the organic light emitting elements 20.

In one embodiment, the organic light emitting element 20 may include an anode, a cathode, and an organic light emitting material disposed between the anode and the cathode. When a driving current is applied to the anode of the organic light emitting element 20, the organic light emitting element 20 may emit light. The organic light emitting element 20 may emit light of different intensities in response to different driving currents, thereby achieving different gray scales of display. Pixel circuits may be disposed in the array substrate 10 to control the intensity of light emitted from the organic light emitting elements 20.

Figure 3:
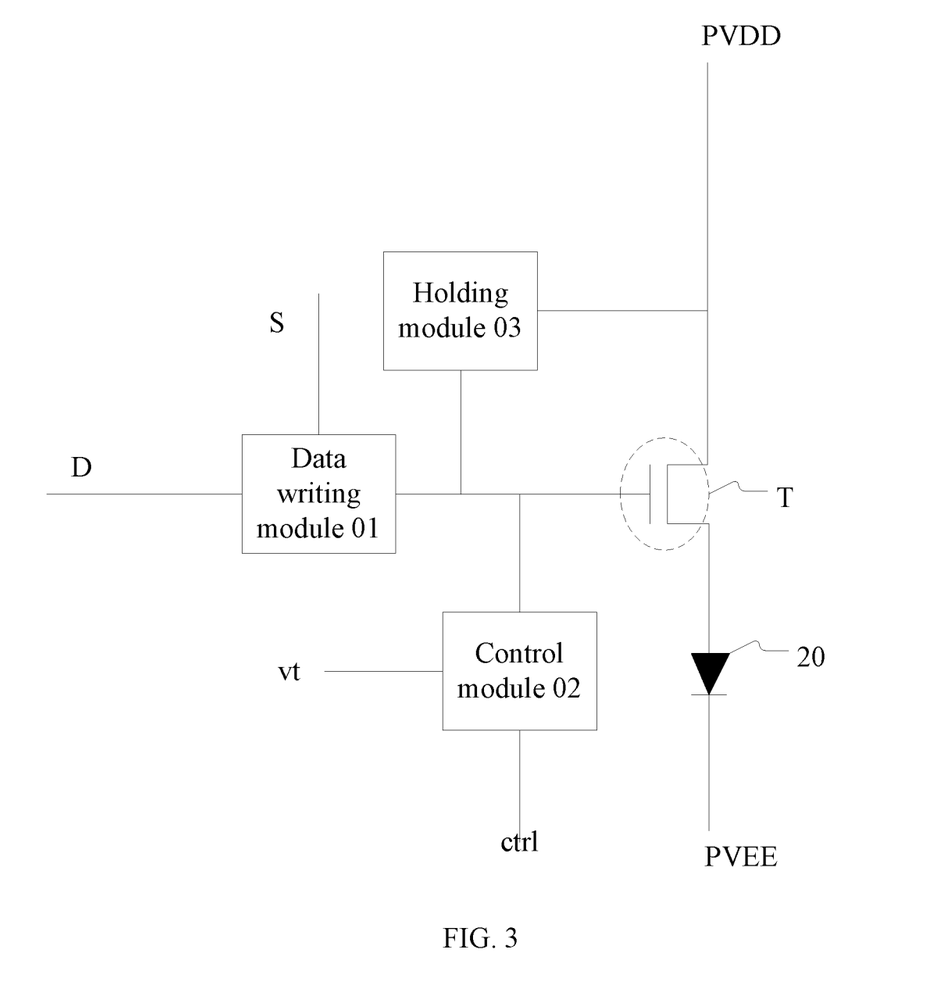
FIG. 3 illustrates a schematic diagram of a pixel circuit of an exemplary organic light emitting display panel according to disclosed embodiments.

FIG. 3 illustrates a schematic diagram of a pixel circuit of an exemplary organic light emitting display panel according to disclosed embodiments. As shown in FIG. 3, the pixel circuit may include a data writing module 01, a control module 02, a holding module 03, and a driving transistor T. The pixel circuit may supply a driving current to an organic light emitting element 20. The modules may include a plurality of switching transistors and/or capacitors. The pixel circuit may be described in the prior art and the description will not be repeated herein.

The gate signal line S and the data signal line D may be electrically connected to the data writing module 01. The driving transistor T may be electrically connected to the organic light emitting element 20. In a cut-off phase, a control signal ctrl may be written to a control terminal of the control module 02 to turn on the control module 02. A cut-off signal vt from an input terminal may be written to the gate electrode of the driving transistor T to control the driving transistor T to operate in a complete cut-off region. Then, based on the control signal inputted from the control terminal, the control module 02 may be turned off. Through the gate signal line S, a scanning driving circuit may write a display scanning driving signal to a control terminal of the data writing module 01 to turn on the data writing module 01. Through the data signal line D, a data driving circuit may write a data driving signal to the gate electrode of the driving transistor T. Based on the data signal inputted from the gate electrode, the driving transistor T generates a corresponding driving current. The driving current may drive the organic light emitting element 20 to emit light. At the same time, the holding module 03 may hold a voltage at the gate electrode of the driving transistor T. The driving transistor T may continuously generate the driving current to drive the organic light emitting element 20 to emit light.

As shown in FIG. 1 and FIG. 2, the gate signal line S may extend from the first display area AA1 to the first bezel area BA1. The gate signal line S may include a third gate signal line S13 and a portion extending into the first bezel area BA1. The portion of the gate signal line extending into the first bezel area BA1 may include a first gate signal line S11 disposed in the first metal layer 11 and a second gate signal line S12 disposed in the second metal layer 12. In the first display area AA1, at least one row of the organic light emitting elements 20 may be electrically connected to the first gate signal line S11, and at least one row of the organic light emitting elements 20 may be electrically connected to the second gate signal line S12.

In the organic light emitting display panel according to the present disclosure, the gate signal lines S in the first bezel area BA1 may include a portion being wired in the first metal layer 11 and another portion being wired in the second metal layer 12. That is, after extending into the first bezel area BA1, different gate signal lines S may be wired in different film layers. Being wired in different film layers may be more flexible as compared to being wired in a same film layer after the gate signal lines S extend into the first bezel area BA1.

Figure 4:
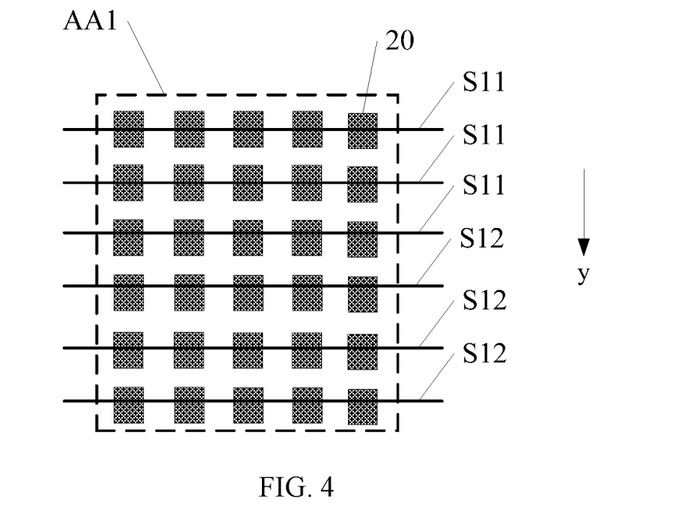
FIG. 4 illustrates a schematic view of a first display area of an exemplary organic light emitting display panel according to disclosed embodiments.

FIG. 4 illustrates a schematic view of a first display area of an exemplary organic light emitting display panel according to disclosed embodiments. In one embodiment, as shown in FIG. 4, the first display area AA1 may include N number of rows of the organic light emitting elements 20 that extend from the first display area AA1 to the second display area (not shown), i.e., in the second direction y. After the gate signal lines that connect to a first row through an (i−1)th row of the organic light emitting elements 20 in the first display area AA1 extend to the first bezel area (not shown), the gate signal lines may connect to the first gate signal lines S11 and may be wired in the first metal layer. After the gate signal lines that connect to an (i)th row through an (N)th row of the organic light emitting elements 20 in the first display area AA1 extend to the first bezel area (not shown), the gate signal lines may connect to the second gate signal lines S12 and may be wired in the second metal layer. N is a positive integer and N≥2. i is a positive integer and 1≤i≤N.

In another embodiment, after the gate signal lines that connect to the (i)th row through the (N)th row of the organic light emitting elements 20 in the first display area AA1 extend to the first bezel area (not shown), the gate signal lines may connect to the first gate signal lines S11 and may be wired in the first metal layer. After the gate signal lines that connect to the first row through the (i−1)th row of the organic light emitting elements 20 in the first display area AA1 extend to the first bezel area (not shown), the gate signal lines may connect to the second gate signal lines S12 and may be wired in the second metal layer.

Specifically, as shown in FIG. 4, the first display area AA1 includes six rows of the organic light emitting elements 20. After the gate signal lines that connect to the first row through the third row of the organic light emitting elements 20 extend to the first bezel area (not shown), the gate signal lines connect to the first gate signal lines S11. After the gate signal lines that connect to the fourth row through the sixth row of the organic light emitting elements 20 extend to the first bezel area (not shown), the gate signal lines connect to the second gate signal lines S12.

In one embodiment, in the organic light emitting display panel, one half of the gate signal lines that extend to the first bezel area may be wired in the first metal layer and another half may be wired in the second metal layer.

In one embodiment, referring to FIG. 1, the organic light emitting display panel may include a third display area AA3. In the first direction x, the first display area AA1 and the third display area AA3 may be disposed on two sides of the first bezel area BA1, respectively. There may be a notch area between the first display area AA1 and the third display area AA3. At the same time, in the first direction x, one row of the organic light emitting elements 20 in the first display area AA1 and one row of the organic light emitting elements 20 in the third display area AA3 may be connected to a same gate signal line that supplies the gate electrode signal. For example, as shown in FIG. 1, the first row of the organic light emitting elements 20 in the first display area AA1 and the first row of the organic light emitting elements 20 in the third display area AA3 may be connected to a same gate signal line that supplies the gate electrode signal. That is, the gate signal line S1 and the gate signal line S2 may be the same gate signal line.

Further, the organic light emitting elements 20 in the first display area AA1, the organic light emitting elements 20 in the second display area AA2, and the organic light emitting elements 20 in the third display area AA3 may be driven from both sides, respectively. That is, both ends of the gate signal lines S1 may be connected to gate electrode driving circuits, both ends of the gate signal lines S2 may be connected to gate electrode driving circuits, and both ends of the gate signal lines S3 may be connected to gate electrode driving circuits. In the first direction x, the gate electrode driving circuits may be configured on both sides of any display area and in the first bezel area BA1.

In the organic light emitting display panel provided by the embodiments of the present disclosure, the notch area may be disposed in the middle in the first direction x. The first display area and the third display area may be disposed on two sides of the notch area, respectively. In the second direction y, the second display area may be disposed adjacent to the notch area. The organic light emitting elements 20 in any of the above described display areas may be driven from both sides. Thus, the entire organic light emitting display panel may be consistently driven, and the desired display effect may be achieved.

In one embodiment, referring to FIG. 1, in the first direction x, the combined number of the organic light emitting elements 20 in the first row in the first display area AA1 and in the first row in the third display area AA3 may be smaller than the number of the organic light emitting elements 20 in one row in the second display area AA2. Specifically, as shown in FIG. 1, the combined number of the organic light emitting elements 20 in the first row in the first display area AA1 and in the first row in the third display area AA3 is eight, and the number of the organic light emitting elements 20 in one row in the second display area AA2 is ten.

In one embodiment, referring to FIG. 2, in the first bezel area BA1, at least one first gate signal line S11 may mutually overlap with at least one second gate signal line S12 in a direction perpendicular to the substrate 19, i.e., in a third direction z.

In the organic light emitting display panel provided by the embodiments of the present disclosure, some gate signal lines in the first bezel area may be wired in the first metal layer and some other gate signal lines in the first bezel area may be wired in the second metal layer. At least one gate signal line wired in the first metal layer may overlap with at least one gate signal line wired in the second metal layer in a direction perpendicular to the organic light emitting display panel. Thus, the area occupied by the first bezel area in a direction parallel to the organic light emitting display panel may be saved. Further, when two gate signal lines overlap, a compensation capacitor may be formed between the two overlapped gate electrode signa lines. The compensation capacitor may contribute to balance the brightness between the notched area and the regular display area and may contribute to narrow the bezel area.

Figure 5:
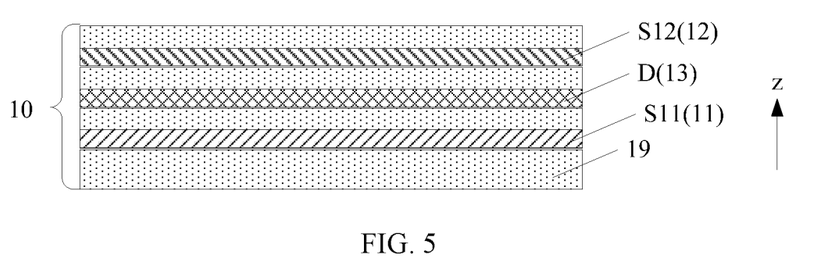
FIG. 5 illustrates a cross-sectional view of an array substrate of another exemplary organic light emitting display panel according to disclosed embodiments.

FIG. 5 illustrates a cross-sectional view of an array substrate of another exemplary organic light emitting display panel according to disclosed embodiments. In one embodiment, as shown in FIG. 5, the organic light emitting display panel may also include a third metal layer 13. The third metal layer 13 may be disposed between the first metal layer 11 and the second metal layer 12. Data signal lines of the organic light emitting display panel may be wired in the third metal layer 13.

In one embodiment, referring to FIG. 1, the number of the organic light emitting elements 20 driven by each gate signal line S1 that connects the organic light emitting elements 20 in the first display area AA1 may be less than the number of the organic light emitting elements 20 driven by each gate signal line S2 that connects the organic light emitting elements 20 in the second display area AA2. To compensate for the unbalanced loads, compensation capacitors may be configured in the organic light emitting display panel. The compensation capacitors may provide capacitance compensation to the gate signal lines S1. Thus, the overall load balance of all the gate signal lines in the organic light emitting display panel may be achieved.

In one embodiment, referring to FIG. 1 and FIG. 5, in the first bezel area BA1, the first gate signal line S11 may mutually overlap with the third metal layer 13 and the second gate signal line S12 may also mutually overlap with the third metal layer 13. Thus, compensation capacitors may be formed between the first gate signal line S11 and the third metal layer 13 and between the second gate signal line S12 and the third metal layer 13.

Figure 6:
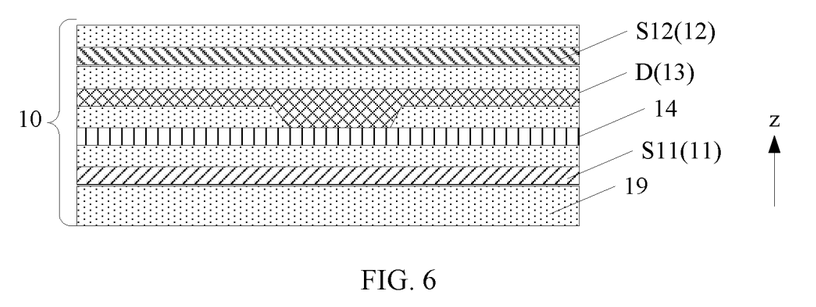
FIG. 6 illustrates a cross-sectional view of an array substrate of another exemplary organic light emitting display panel according to disclosed embodiments.

FIG. 6 illustrates a cross-sectional view of an array substrate of another exemplary organic light emitting display panel according to disclosed embodiments. Referring to FIG. 1 and FIG. 6, the organic light emitting display panel may also include a fourth metal layer 14. The fourth metal layer 14 may be disposed between the first metal layer 11 and the third metal layer 13. In the first bezel area BA1, the third metal layer 13 may be connected to the fourth metal layer 14 by through-holes, such that a compensation capacitor may be formed between the first gate signal line S11 and the fourth metal layer 14. At the same time, the third metal layer 13 may form an auxiliary plate of the compensation capacitor to increase the compensation capacitance.

Figure 7:
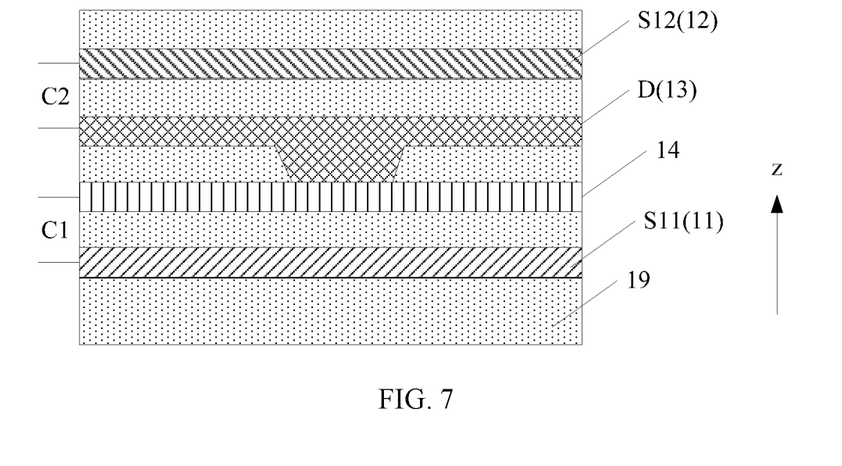
FIG. 7 illustrates a schematic view of compensation capacitors in an array substrate of an exemplary organic light emitting display panel according to disclosed embodiments.

FIG. 7 illustrates a schematic view of compensation capacitors in an array substrate of an exemplary organic light emitting display panel according to disclosed embodiments. In the first bezel area, as shown in FIG. 7, at least one first gate signal line S11 may mutually overlap with the fourth metal layer 14 to form a first compensation capacitor C1. At least one second gate signal line S12 may mutually overlap with the third metal layer 13 to form a second compensation capacitor C2. Thus, two layers of compensation capacitors may be formed in the third direction z, and the area occupied by the compensation capacitors in the bezel area may be reduced.

In one embodiment, referring to FIG. 1, FIG. 6, and FIG. 7, in the first bezel area, in the third direction z perpendicular to the substrate 19, an orthogonal projection of the third metal layer 13 may completely overlap with an orthogonal projection of the second gate signal line S12, and an orthogonal projection of the fourth metal layer 14 may completely overlap with an orthogonal projection of the first gate signal line S11, to reduce the area occupied by the compensation capacitors in the bezel area to the maximum extent. In particular, the organic light emitting elements in the first display area and in the third display area may be driven from both sides, i.e., two-sided driving. In this type of organic light emitting display panel, the number of gate signal lines in the first bezel area may be greater than that of one-sided driving. In this case, the area occupied by the compensation capacitors in the bezel area may be reduced. Thus, the two-sided driving may be implemented in the limited bezel area.

In one embodiment, referring to FIG. 6 or FIG. 7, in the first bezel area, the first gate signal line S11, the second gate electrode signal line S12, the third metal layer 13, and the fourth metal layer 14 may mutually overlap with each other to increase the capacitance of the compensation capacitors.

In one embodiment, referring to FIG. 1, the gate signal line S13 in the first display area AA1 that connects to the first gate signal line S11 in the first bezel area BA1 may be disposed in a same layer, i.e., the first metal layer 11, with the first gate signal line S11. The gate signal line S14 in the first display area AA1 that connects to the second gate signal line S12 in the first bezel area BA1 may be disposed in a same layer, i.e., the second metal layer 12, with the second gate signal line S12. As such, when reaching the bezel area, the gate signal line that drives a row of organic light emitting elements 20 in the first display area AA1 may be wired in either the first metal layer 11 or the second metal layer 12, without the need for through-holes.

In one embodiment, referring to FIG. 1, the gate signal lines including the gate signal line S13 and the gate signal line S14 in the first display area AA1, and the gate signal line S2 in the second display area AA2 may be disposed in the first metal layer 11. As such, all the gate signal lines in the display area AA of the organic light emitting display panel may be disposed in a same metal layer, which is convenient for the placement and layout of the pixel circuits in the display area AA. At least one gate signal line in the first display area AA1 may connect to the second metal layer 12 via through-holes after extending to the first bezel area BA1. For example, the gate signal line S14 in the first display area AA1 may connect to the second metal layer 12 via through-holes after extending to the first bezel area BA1. That is, after extending to the first bezel area BA1, the gate signal line S14 may be wired in second metal layer 12, thereby forming the second gate signal line S12.

In another embodiment, referring to FIG. 1, the gate signal lines including the gate signal line S13 and the gate signal line S14 in the first display area AA1, and the gate signal line S2 in the second display area AA2 may be disposed in the second metal layer 12. At least one gate signal line in the first display area AA1 may connect to the first metal layer 11 via through-holes after extending to the first bezel area BA1. For example, the gate signal line S13 in the first display area AA1 may connect to the first metal layer 11 via through-holes after extending to the first bezel area BA1. That is, after extending to the first bezel area BA1, the gate signal line S13 may be wired in the first metal layer 11, thereby forming the first gate signal line S11.

[Please add figures and description of page 6 of the PPT], it seems this content is not included (maybe described in a different way, but it looks different, and we need to include this using the exact terminology of the PPT).

Figure 8:
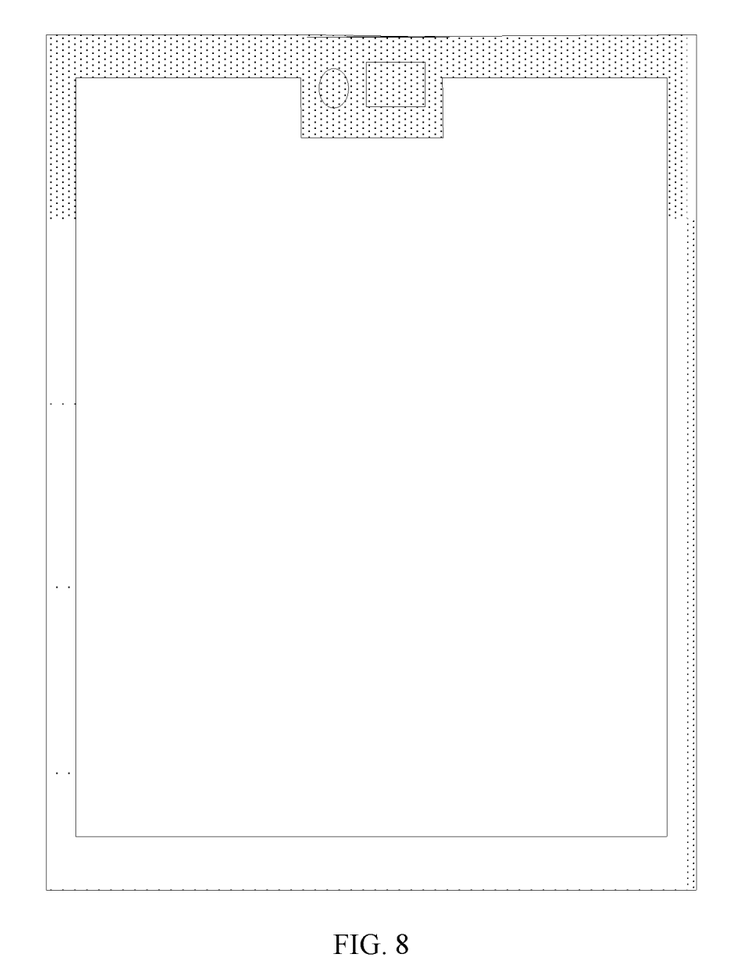
FIG. 8 illustrates a schematic diagram of an exemplary organic light emitting display apparatus according to disclosed embodiments.

The organic light emitting display panel has been described above in various embodiments according to the present disclosure. The present disclosure also provides an organic light emitting display apparatus. FIG. 8 illustrates a schematic diagram of an exemplary organic light emitting display apparatus according to disclosed embodiments. As shown in FIG. 8, the display apparatus may include a housing and an organic light emitting display panel. The organic light emitting display panel may be an organic light emitting display panel provided by any one of the above embodiments and may have the corresponding technical characteristics and technical effects, which will not be repeated herein.

It can be seen from the above embodiments that the organic light emitting display panel and the organic light emitting display apparatus provide the following beneficial effects.

The organic light emitting display panel may include display areas in different sizes in the first direction. In the bezel area adjacent to a smaller display area, some gate signal lines may be wired in the first metal layer, and some other gate signal lines may be wired in the second metal layer. That is, after extending from the smaller display area to the bezel area, different gate signal lines may be wired in different film layers. As such, it is more flexible to wire the gate signal lines in the bezel area, which supply driving signals to the organic light emitting elements in the smaller display area. Thus, it is beneficial to balance the brightness in different display areas of the organic light emitting display panel, it is beneficial to drive the organic light emitting elements in the entire organic light emitting display panel from both sides, and the wiring layout in the bezel area may be optimized.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. An organic light emitting display panel, comprising:
an array substrate and a plurality of organic light emitting elements disposed on the array substrate, wherein the array substrate includes a substrate, and a first metal layer and a second metal layer sequentially disposed toward the plurality of organic light emitting elements;
a first display area, a second display area, and a first bezel area, wherein, in a first direction, a number of organic light emitting elements in a row of organic light emitting elements in the first display area is smaller than a number of organic light emitting elements in a row of organic light emitting elements in the second display area, and the first bezel area is disposed adjacent to the first display area in the first direction; and
a plurality of gate signal lines configured to supply gate driving signals to the organic light emitting elements, the gate signal lines in the first display area extending to the first bezel area,
wherein the gate signal lines extending to the first bezel area include first gate signal lines disposed in the first metal layer and second gate signal lines disposed in the second metal layer; at least one row of organic light emitting elements in the first display area are connected to the first gate signal lines; and at least another row of organic light emitting elements in the first display area are connected to the second gate signal lines.

2. The display panel according to claim 1, wherein:
the first display area includes N number of rows of organic light emitting elements; and
in a direction from the first display area to the second display area, after extending to the first bezel area, the gate signal lines that connect to a first row through an (i−1)th row of the organic light emitting elements in the first display area connect to the first gate signal lines, and the gate signal lines that connect to an (i)th row through an (N)th row of the organic light emitting elements in the first display area connect to the second gate signal lines, where N is a positive integer and N≥2, and i is a positive integer and 1≤i≤N.

3. The display panel according to claim 1, wherein:
the organic light emitting display panel further includes a third display area;
in the first direction, the first display area and the third display area are disposed on two sides of the first bezel area, respectively; and
in the first direction, a same gate signal line supplies signals to a row of organic light emitting elements in the first display area and a row of organic light emitting elements in the third display area.

4. The display panel according to claim 3, wherein:
in the first direction, a combined number of the organic light emitting elements in a same row of organic light emitting elements split in the first display area and the third display area is smaller than the number of the organic light emitting elements in a row of organic light emitting elements in the second display area.

5. The display panel according to claim 1, wherein:
in the first bezel area, at least one first gate signal line mutually overlaps with at least one second gate signal line in a direction perpendicular to the substrate.

6. The display panel according to claim 1, further including:
a third metal layer disposed between the first metal layer and the second metal layer; and
data lines disposed in the third metal layer.

7. The display panel according to claim 6, wherein:
in the first bezel area, the first gate signal lines mutually overlap with the third metal layer and the second gate signal lines mutually overlap with the third metal layer.

8. The display panel according to claim 6, further including:
a fourth metal layer disposed between the first metal layer and the third metal layer and connected to the third metal via through-holes in the first bezel area.

9. The display panel according to claim 8, wherein:
in the first bezel area, at least one first gate signal line mutually overlaps with the fourth metal layer to form a first compensation capacitor, and at least one second gate signal line mutually overlaps with the third metal layer to form a second compensation capacitor.

10. The display panel according to claim 8, wherein:
in the first bezel area, in a direction perpendicular to the substrate, an orthogonal projection of the third metal layer completely overlaps with an orthogonal projection of the second gate signal lines and an orthogonal projection of the fourth metal layer completely overlaps with an orthogonal projection of the first gate signal lines.

11. The display panel according to claim 6, wherein:
in the first bezel area, the first gate signal lines, the second gate signal lines, the third metal layer, and the fourth metal layer mutually overlap with each other.

12. The display panel according to claim 1, wherein:
the gate signal lines in the first display area, which are connected to the first gate signal lines in the first bezel area, are disposed in a same layer as the first gate signal lines.

13. The display panel according to claim 1, wherein:
in the first display area, all the gate signal lines are disposed in the first metal layer, and at least one gate signal line extends to the first bezel area to connect to the second metal layer via through-holes; or
in the first display area, all the gate signal lines are disposed in the second metal layer, and at least one gate signal line extends to the first bezel area to connect to the first metal layer via through-holes.

14. An organic light emitting display apparatus, comprising an organic light emitting display panel, which includes:
an array substrate and a plurality of organic light emitting elements disposed on the array substrate, wherein the array substrate includes a substrate, and a first metal layer and a second metal layer sequentially disposed toward the plurality of organic light emitting elements;
a first display area, a second display area, and a first bezel area, wherein, in a first direction, a number of organic light emitting elements in a row of organic light emitting elements in the first display area is smaller than a number of organic light emitting elements in a row of organic light emitting elements in the second display area, and the first bezel area is disposed adjacent to the first display area in the first direction; and
a plurality of gate signal lines configured to supply gate driving signals to the organic light emitting elements, the gate signal lines in the first display area extending to the first bezel area,
wherein the gate signal lines extending to the first bezel area include first gate signal lines disposed in the first metal layer and second gate signal lines disposed in the second metal layer; at least one row of organic light emitting elements in the first display area are connected to the first gate signal lines; and at least another row of organic light emitting elements in the first display area are connected to the second gate signal lines.

15. The display apparatus according to claim 14, wherein:
the first display area includes N number of rows of organic light emitting elements; and
in a direction from the first display area to the second display area, after extending to the first bezel area, the gate signal lines that connect to a first row through an $(i-1)$th row of the organic light emitting elements in the first display area connect to the first gate signal lines, and the gate signal lines that connect to an $(i)$th row through an $(N)$th row of the organic light emitting elements in the first display area connect to the second gate signal lines, where N is a positive integer and $N \geq 2$, and i is a positive integer and $1 \leq i \leq N$.

16. The display apparatus according to claim 14, wherein:
the organic light emitting display panel further includes a third display area;
in the first direction, the first display area and the third display area are disposed on two sides of the first bezel area, respectively; and
in the first direction, a same gate signal line supplies signals to a row of organic light emitting elements in the first display area and a row of organic light emitting elements in the third display area.

* * * * *